(12) United States Patent
Liang

(10) Patent No.: US 10,930,598 B2
(45) Date of Patent: Feb. 23, 2021

(54) DISPLAY DEVICE AND FLEXIBLE CIRCUIT BOARD THEREOF

(71) Applicants: HKC CORPORATION LIMITED, Shenzhen (CN); CHONGQING HKC OPTOELECTRONICS TECHNOLOGY CO., LTD., Chongqing (CN)

(72) Inventor: Shuozhen Liang, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/491,376

(22) PCT Filed: Oct. 10, 2017

(86) PCT No.: PCT/CN2017/105512
§ 371 (c)(1),
(2) Date: Sep. 5, 2019

(87) PCT Pub. No.: WO2018/166192
PCT Pub. Date: Sep. 20, 2018

(65) Prior Publication Data
US 2020/0027843 A1    Jan. 23, 2020

(30) Foreign Application Priority Data

Mar. 14, 2017  (CN) .......................... 201710165406.9

(51) Int. Cl.
*H05K 1/00*  (2006.01)
*H05K 1/02*  (2006.01)
*H05K 1/11*  (2006.01)
*H05K 1/18*  (2006.01)
*H05K 3/32*  (2006.01)
(Continued)

(52) U.S. Cl.
CPC ........ *H01L 23/544* (2013.01); *G02F 1/13452* (2013.01); *H01L 23/4985* (2013.01);
(Continued)

(58) Field of Classification Search
CPC ... H05K 1/00; H05K 1/02; H05K 1/11; H05K 1/18; H05K 3/32; H05K 3/36; H05K 5/00;
(Continued)

(56) References Cited

U.S. PATENT DOCUMENTS 5,592,365 A * 1/1997 Sugimoto .............. H05K 3/323
                                                                361/789
5,949,502 A * 9/1999 Matsunaga ....... G02F 1/136204
                                                                349/40
(Continued)

*Primary Examiner* — Xiaoliang Chen
(74) *Attorney, Agent, or Firm* — Wang Law Firm, Inc.

(57) ABSTRACT

A display apparatus and the flexible circuit board thereof are provided. A flexible circuit board, includes: a flexible substrate; a driving chip disposed on the flexible substrate, wherein the driving chips is configured to form a driving signal; a plurality of binding pins disposed on at least one side of the flexible substrate, wherein the binding pins are configured to bind and connect an external signal line to the driving chip; and a binding mark disposed on the flexible substrate and positioned at a pin area within two outermost binding pins of the binding pins, wherein the binding mark is configured to perform an alignment operation of the flexible substrate being applied with a binding operation.

16 Claims, 6 Drawing Sheets

(51) Int. Cl.
| | | |
|---|---|---|
| *H05K 3/36* | (2006.01) | |
| *H05K 5/00* | (2006.01) | |
| *H05K 7/02* | (2006.01) | |
| *H01L 23/00* | (2006.01) | |
| *H01L 23/498* | (2006.01) | |
| *H01L 23/544* | (2006.01) | |
| *H01L 27/15* | (2006.01) | |
| *H01L 27/32* | (2006.01) | |
| *G02F 1/13* | (2006.01) | |
| *G02F 1/1333* | (2006.01) | |
| *G02F 1/1345* | (2006.01) | |
| *G06F 3/041* | (2006.01) | |
| *G09G 5/00* | (2006.01) | |

(52) U.S. Cl.
CPC ............. *H01L 23/49838* (2013.01); *H01L 2223/54426* (2013.01)

(58) Field of Classification Search
CPC ......... H05K 7/02; H01L 23/00; H01L 23/498; H01L 23/544; H01L 27/15; H01L 27/32; G02F 1/13; G02F 1/1333; G02F 1/1345; G06F 3/041; G09G 5/00
USPC .......... 361/749, 679.02, 767, 776, 789, 807; 345/173; 216/23, 24, 129, 149–153; 257/40, 88, 368, 620, 737, 779, 781, 797
See application file for complete search history.

(56) References Cited

U.S. PATENT DOCUMENTS

| | | | |
|---|---|---|---|
| 6,411,359 B1* | 6/2002 | Kobayashi | G02F 1/13452 349/149 |
| 6,621,542 B1* | 9/2003 | Aruga | G02F 1/1333 349/113 |
| 6,930,745 B1* | 8/2005 | Miyazaki | G02F 1/1339 349/153 |
| 9,082,774 B1* | 7/2015 | Shin | H05K 1/147 |
| 2002/0027634 A1* | 3/2002 | Kang | H05K 3/361 349/150 |
| 2004/0182817 A1* | 9/2004 | Murai | G02F 1/13452 216/23 |
| 2005/0242436 A1* | 11/2005 | Abe | H01L 23/544 257/737 |
| 2006/0103412 A1* | 5/2006 | Kimura | G09G 3/006 73/865.8 |
| 2006/0132692 A1* | 6/2006 | Mo | H05K 3/361 349/129 |
| 2006/0146263 A1* | 7/2006 | Park | H05K 3/0052 349/149 |
| 2008/0174979 A1* | 7/2008 | Furihata | H05K 1/0269 361/807 |
| 2008/0253074 A1* | 10/2008 | Shie | H05K 3/361 361/679.02 |
| 2009/0206411 A1* | 8/2009 | Koketsu | H01L 24/81 257/368 |
| 2011/0074759 A1* | 3/2011 | Chae | H01J 11/10 345/211 |
| 2011/0122356 A1* | 5/2011 | Saimen | H05K 1/0269 349/149 |
| 2013/0161661 A1* | 6/2013 | Akamatsu | G02F 1/133305 257/88 |
| 2015/0108611 A1* | 4/2015 | Kumagai | H01L 23/5226 257/620 |
| 2016/0117042 A1* | 4/2016 | Ito | G06F 3/0446 345/173 |
| 2016/0291723 A1* | 10/2016 | Kurasawa | G06F 3/0446 |

* cited by examiner

DISPLAY DEVICE AND FLEXIBLE CIRCUIT BOARD THEREOF

BACKGROUND OF THE INVENTION

1. Field of the Invention

This application is a National Stage Application of PCT International Patent Application No. PCT/CN2017/105512 filed on Oct. 10, 2017, under 35 U.S.C. § 371, which claims priority to and the benefit of Chinese Patent Application No. 201710165406.9, filed on Mar. 14, 2017, and the disclosure of which is incorporated herein in its entirety by reference.

The present disclosure is related to the display device technology, in particular, related to a display apparatus and the flexible circuit board thereof.

2. Description of the Related Art

With the development of technology, the design requirements for the display panels have become higher and higher. A traditional display panel is generally driven through a driving chip on a flexible circuit board. A binding mark is made in an area of the flexible circuit board when the flexible circuit board is bound with the display panel. A normal binding mark is disposed at two sides of a pin which is required for binding. Hence, the total spacing length of the pins on a flexible circuit board of the same format may also be reduced, further resulting in a reduced spacing between the pins. Furthermore, the reduced spacing between the pins may cause the quality of products unable to achieve this requirement and decreasing the yield of the products.

SUMMARY OF THE INVENTION

Based on these, it is necessary to provide a display apparatus and a flexible circuit board thereof which improve the utilization rate and the product yield.

A flexible circuit board includes: a flexible substrate; a driving chip disposed on the flexible substrate, wherein the driving chip is configured to form a driving signal; a plurality of binding pins disposed on at least one side of the flexible substrate, wherein the binding pins are configured to bind and connect an external signal line to the driving chip; and a binding mark disposed on the flexible substrate and positioned at a pin area within two outermost binding pins of the binding pins, wherein the binding mark is configured to perform an alignment operation of the flexible substrate being applied with a binding operation.

In an embodiment, each of the binding pins is disposed at one side of the flexible substrate; the number of the binding marks is at least two; and the at least two binding marks are positioned at different positions of the pin area.

In an embodiment, the number of the binding marks is two; and the two binding marks are distributed within the pin area symmetrically.

In an embodiment, each of the binding pins is disposed at two sides of the flexible substrate; two of the binding marks are disposed at each side of the pin area; and the two binding marks are disposed symmetrically about a central axis of the driving chip.

In an embodiment, an alignment clearance area is disposed within the pin area; no binding pin is in the alignment clearance area so that a length of the binding pin extending in a direction toward the alignment clearance area is less than the length of the binding pins in other areas; and the binding mark is disposed within the alignment clearance area.

In an embodiment, the binding mark is attached to the flexible substrate; and all of the binding marks and each of the binding pins are made of metal.

In an embodiment, the binding mark is a binding mark assembly; and each of the binding mark assemblies includes two binding units having different shapes.

In an embodiment, the binding mark has a shape of cross-shape, rectangle, T-shape or L-shape.

The present disclosure further provides a display apparatus includes: a display panel including a signal line; a flexible circuit board including: a flexible substrate; a driving chip disposed on the flexible substrate, wherein the driving chip is configured to form a driving signal; a plurality of binding pins disposed on at least one side of the flexible substrate, wherein the binding pins are configured to bind and connect an external signal line to the driving chip; and a binding mark disposed on the flexible substrate and positioned at a pin area within two outermost binding pins of the binding pins, wherein the binding mark is configured to perform an alignment operation of the flexible substrate being applied with a binding operation.

A method of manufacturing a display apparatus includes: providing a flexible circuit board; disposing a binding mark at a pin area within two outermost binding pins of the at least one side of the flexible circuit board; and aligning the binding mark of the flexible circuit board and a mark on a display panel, and binding and connecting the binding pins of the flexible circuit board to the signal line of the display panel.

Regarding to the aforementioned flexible circuit board, the binding mark is disposed in the area where the binding pins are positioned. Hence, it is unnecessary to dispose a binding mark location area outside the binding pins area of the flexible circuit board, so that the total spacing length of the binding pins on the flexible circuit board will become longer, the spacing between the binding pins will become wider, and the utilization rate and the yield of the flexible circuit board will be improved.

DESCRIPTION OF THE PREFERRED EMBODIMENTS

For ease of understanding the purpose, technical solutions and advantages of the present disclosure more clearly, the present disclosure will be further described in details taken in conjunction with appending drawings and embodiments. It has to be understood that the particular embodiments described herein are merely for explaining the present disclosure, and are not intended to limit the present disclosure.

Figure 1:
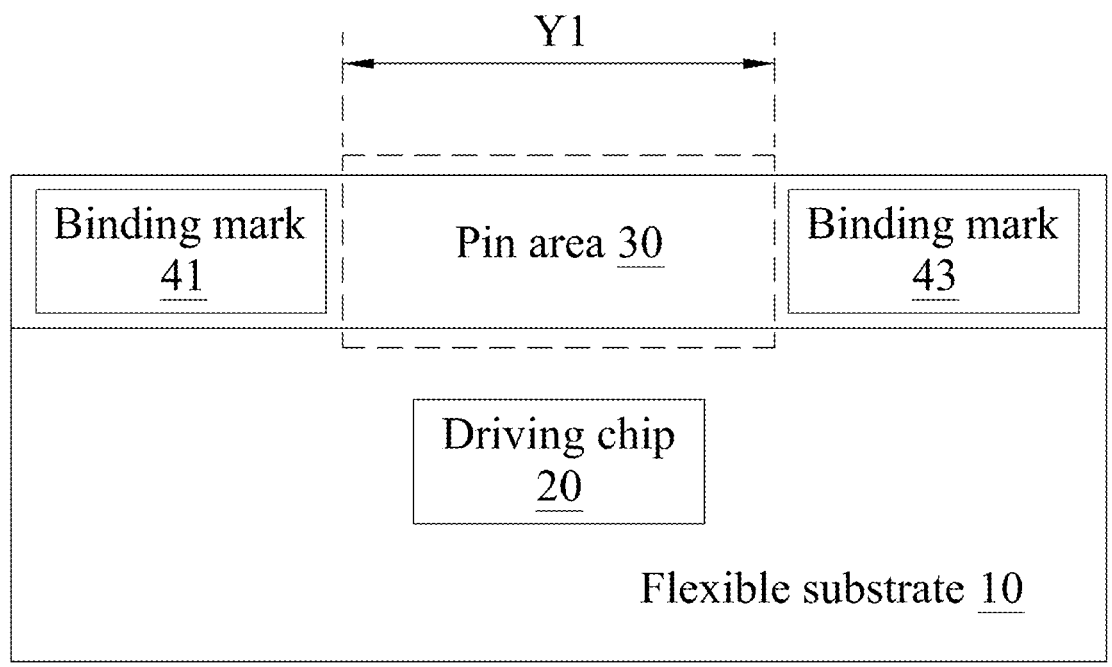
FIG. 1 is a block diagram of the structure of an exemplary flexible circuit board.

A traditional liquid crystal display panel is generally driven through a driving chip on the flexible circuit board. A binding mark is made in an area of the flexible circuit board when the flexible circuit board is bound with the display panel. A normal binding mark is disposed at two sides of a pin. Hence, the total spacing length of the pins on a flexible circuit board of the same format may also be reduced, further resulting in a reduced spacing between the pins. As shown in FIG. 1, a traditional flexible circuit board includes a flexible substrate 10, a driving chip 20, a pin area 30, and a binding mark 41 and a binding mark 43. The pin area 30 is an area where the binding pins within the two outermost binding pins are located. The binding mark 41 and the binding mark 43 are disposed at two sides of the pin area 30. Since spaces for the binding mark 41 and the binding mark 43 should be reserved at the side of the flexible substrate 10 which the pin area 30 is disposed, the total spacing length Y1 of the binding pins is reduced correspondingly, further resulting in the reduced spacing between the pins and the decreased utilization rate of the flexible circuit board. Furthermore, the decrease of the spacing between the pins may cause the quality of products failing to achieve their requirements and the decreasing the yield of the products.

Figure 2:
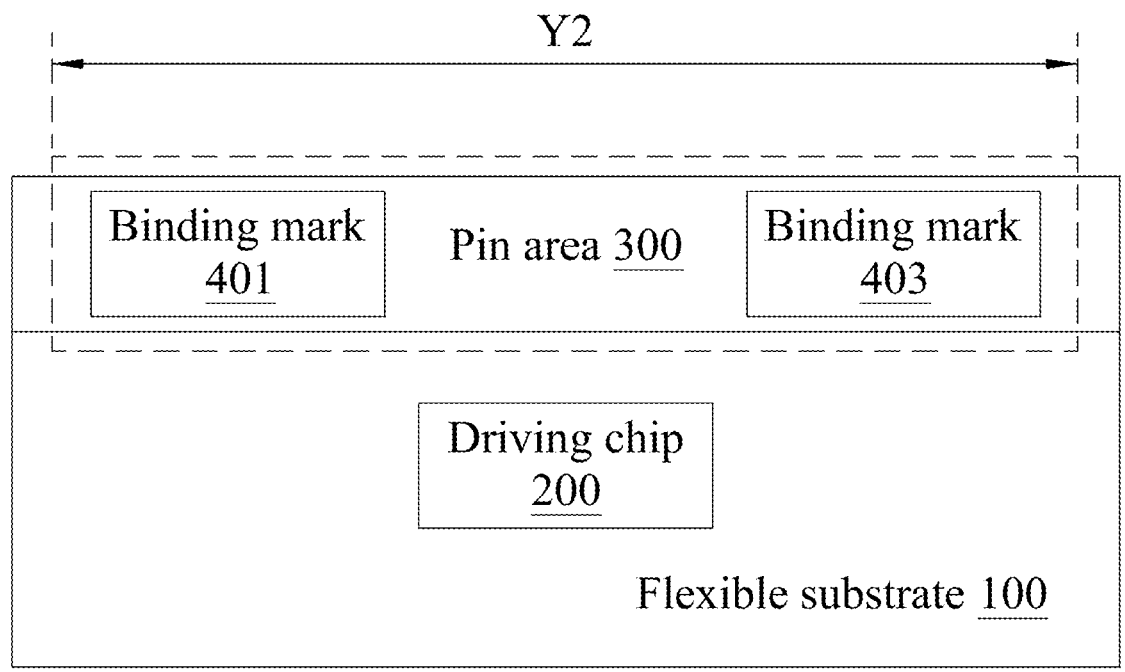
FIG. 2 is a block diagram of the structure of a flexible circuit of the embodiments in the present disclosure.

The present embodiment provides a flexible circuit board which improves the utilization rate and the product yield. As shown in FIG. 2, the flexible circuit board includes a flexible substrate 100, a driving chip 200 and binding pins (not shown in the drawings). The driving chip 200 is disposed on the flexible circuit board, and is configured to drive a liquid crystal display panel when the flexible circuit board is connected to the liquid crystal display panel. The binding pins are disposed within a pin area 300 at a side of the flexible substrate 100. The pin area 300 is an area where the binding pins within two outermost binding pins located. In the present embodiment, the number of the binding marks is two, that is, a binding mark 401 and a binding mark 403. In other embodiments, the number of the binding marks may be three or more than three. Further, the binding marks may be positioned at different positions within the pin area. The binding mark 401 and the binding mark 403 are disposed within the pin area 300. Hence, it is unnecessary to dispose a binding mark location area outside the pin area 300 of the flexible substrate 100, so that the total spacing length of the binding pins on the flexible circuit board will become longer, the spacing between the binding pins will become wider, and the utilization rate and the yield of the flexible circuit board will be improved.

Please refer to FIGS. 1 and 2. FIGS. 1 and 2 are flexible circuit boards having the same format. The flexible circuit board of FIG. 1 disposes the binding mark 41 and the binding mark 43 at two sides of the pin area 30, wherein the total spacing length of the binding pins is Y1. The flexible circuit board of FIG. 2 disposes the binding mark 401 and the binding mark 403 within the pin area 300, wherein the total spacing length of the binding pins is Y2. Since it is unnecessary to reserve the positions for the binding mark 401 and the binding mark 403, Y2 is longer than Y1. That is, the total spacing length of the binding pins in FIG. 2 becomes longer, so that the spacing between the binding pins becomes wider, resulting in improved utilization rate and yield of the flexible circuit board.

The binding mark may be disposed at one side or two sides of the flexible substrate of the flexible circuit board depending on the required binding area of the flexible circuit board. In an embodiment, when the binding pins are disposed at one side of the flexible substrate, the number of the binding marks is two, so that the flexible circuit board accurately aligns to the liquid crystal display panel. The two binding marks are positioned at different positions within the pin area 300. The binding marks may be distributed within the pin area 300 symmetrically. In an embodiment, when the binding pins are disposed at two sides of the flexible substrate 100 of the flexible circuit board, two binding marks are disposed within the pin area 300 of the each side of the flexible substrate 100, so that the two sides of the flexible circuit board will be accurately aligned to the liquid crystal display panel individually when the flexible circuit board is aligning to the liquid crystal display panel. The two binding marks of each side of the flexible circuit board are disposed symmetrically about a central axis of the driving chip 200 on the flexible substrate 100. The binding mark may be a binding mark assembly. Each of the binding mark assemblies includes two binding units having different shapes. The binding unit has a shape of cross-shape, rectangle, T-shape or L-shape. The accuracy of alignment may be improved by a binding mark assembly combined by the different shapes of the binding units. The binding mark may be attached to the flexible circuit substrate 100. The binding mark and the binding pins may be made of the same metal material, for instance, all of these are made of copper. The manufacture process may be simplified by manufacturing the binding mark and the binding pins made of the same metal material.

Figure 3:
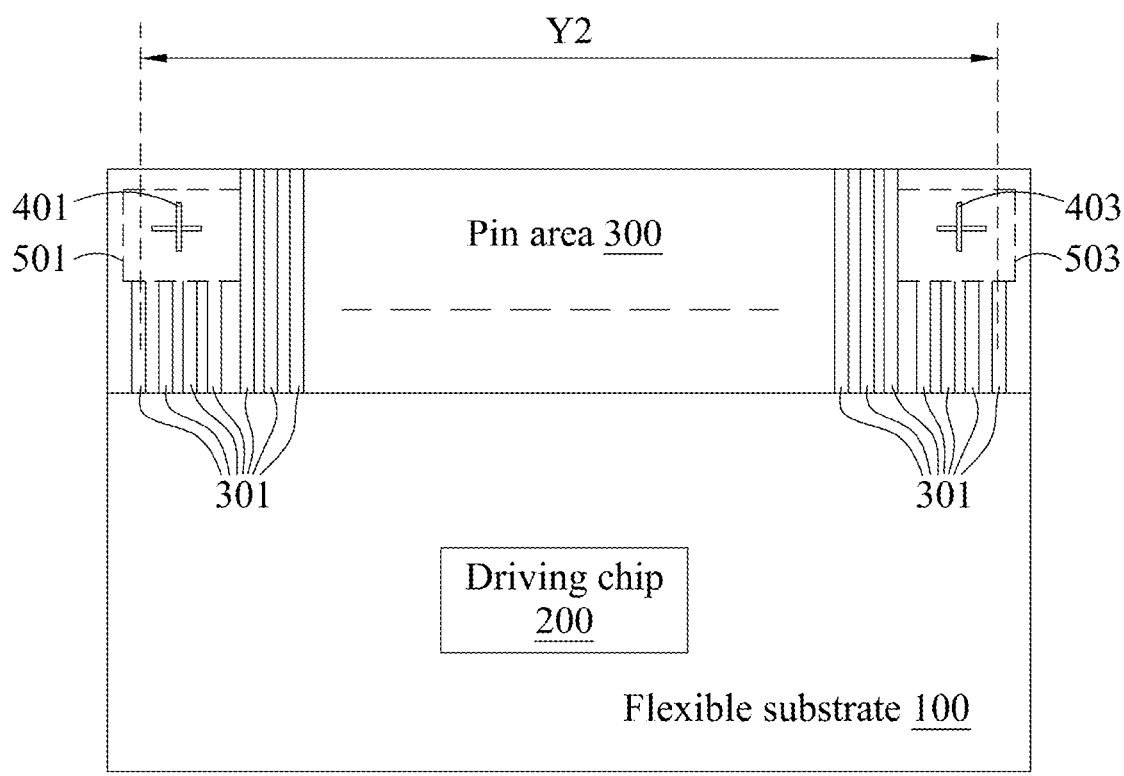
FIG. 3 is a schematic diagram of the structure of a flexible circuit of an embodiment in FIG. 2.

In an embodiment, an alignment clearance area is disposed within the pin area 300. The binding mark is disposed in the alignment clearance area. The alignment clearance area does not have any of the binding pins, so that the length of the binding pin extending in a direction toward the alignment clearance area is less than a length of the binding pin in other areas. As shown in FIG. 3, an alignment clearance area 501 and an alignment clearance area 503 are disposed in the pin area 300. The binding mark 401 is disposed in the alignment clearance area 501. The binding mark 403 is disposed in the alignment clearance area 503. The alignment clearance area 501 and the alignment clearance area 503 do not have any of the binding pins 301. The length of the binding pin 301 between the alignment clearance area 501 (502) and the driving chip 200 is less than the length of the binding pin 301 in other areas.

Figure 4:
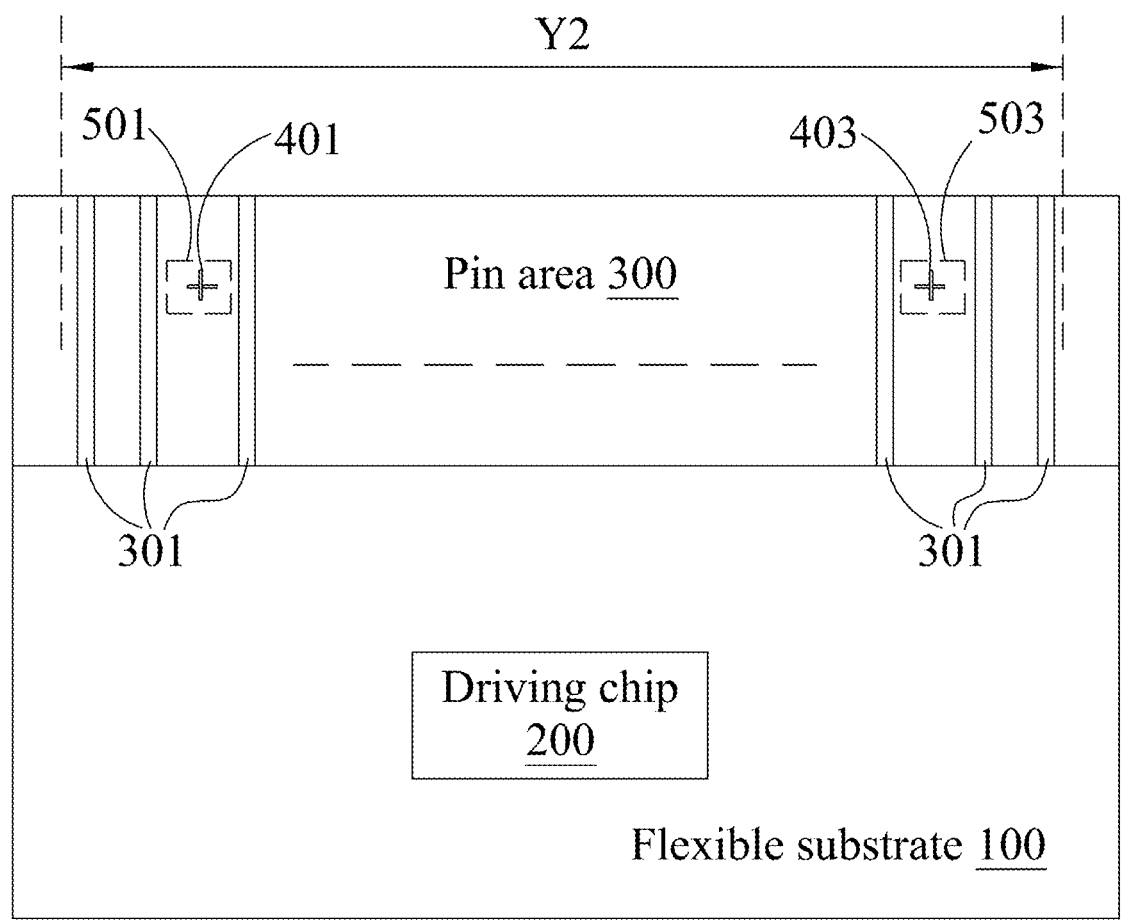
FIG. 4 is a schematic diagram of the structure of a flexible circuit of another embodiment in FIG. 2.

In an embodiment, the area range of the alignment clearance is very small so that the alignment clearance area and the binding mark are disposed between two binding pins. In this case, all of the lengths of the binding pins within the pin area are the same. Hence, the flexible circuit board does not need to dispose a binding mark location area outside the binding pin area, and the pin area does not need to modify the adaptability of the binding pin for preserving the binding mark. As shown in FIG. 4, when the areas of the alignment clearance area 501 and the alignment clearance area 503 are very small and thereby can be disposed between two binding pins 301, the alignment clearance area 501 and the binding mark 401 and the alignment clearance area 503 and the binding mark 403 are disposed between the two binding pins 301. In this case, all of the lengths of the binding pins 301 within the binding pin area 300 are the same. Hence, the binding pins 301 do not need to be modified in order to meet the requirement of the alignment clearance area.

Figure 5:
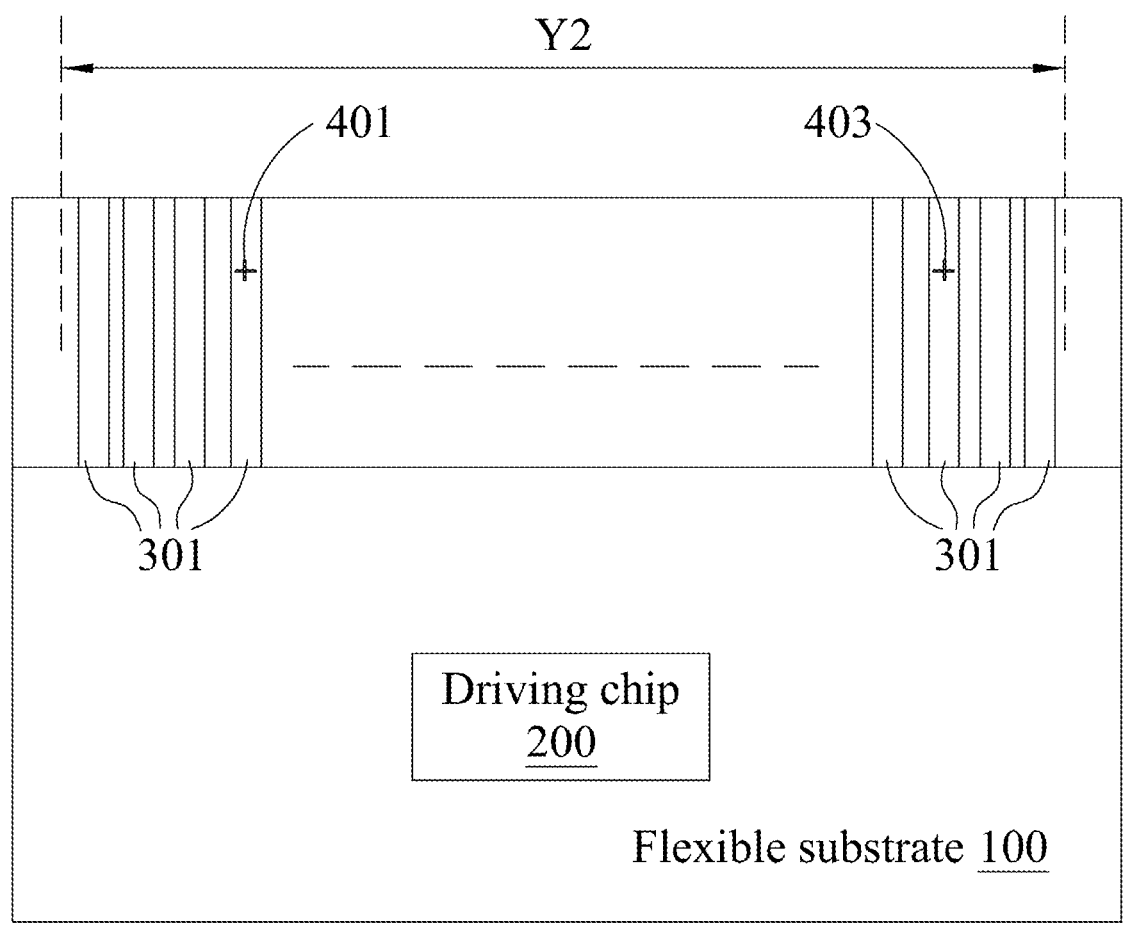
FIG. 5 is a schematic diagram of the structure of a flexible circuit of yet another embodiment in FIG. 2.

In an embodiment, the binding mark does not need to be disposed within the alignment clearance area, that is, an alignment clearance area does not need to be disposed in the pin area. The size of the binding mark is very small so that the binding mark is able to be disposed on the binding pins. The binding mark is disposed on the binding pins. A binding mark location does not need to be reserved within the binding pin area. The binding mark and the binding pin are all made of metal material, so that the manufacture art may be simplified. Also, the binding mark and the binding pins are made of the same material, so that the attachment of the binding pins and the signal line of the liquid crystal display panel and the transmission of the signal in the binding pins will not be affected when the binding mark is disposed on the binding pins. As shown in FIG. 5, the binding mark 401 and the binding mark 403 may be disposed on any one of the binding pins 301. The binding mark 401 and the binding mark 403 are made of the same metal material as the binding pins 301, so that the manufacturing process may be simplified. Also, the binding mark 401 and the binding mark 403 are made of the same material as the binding pins 301, so that the attachment of the binding pins 301 and the liquid crystal display panel and the transmission of the signal in the binding pins 301 will not be affected when the binding mark 401 and the binding mark 403 are disposed on the binding pins 301.

Figure 6:
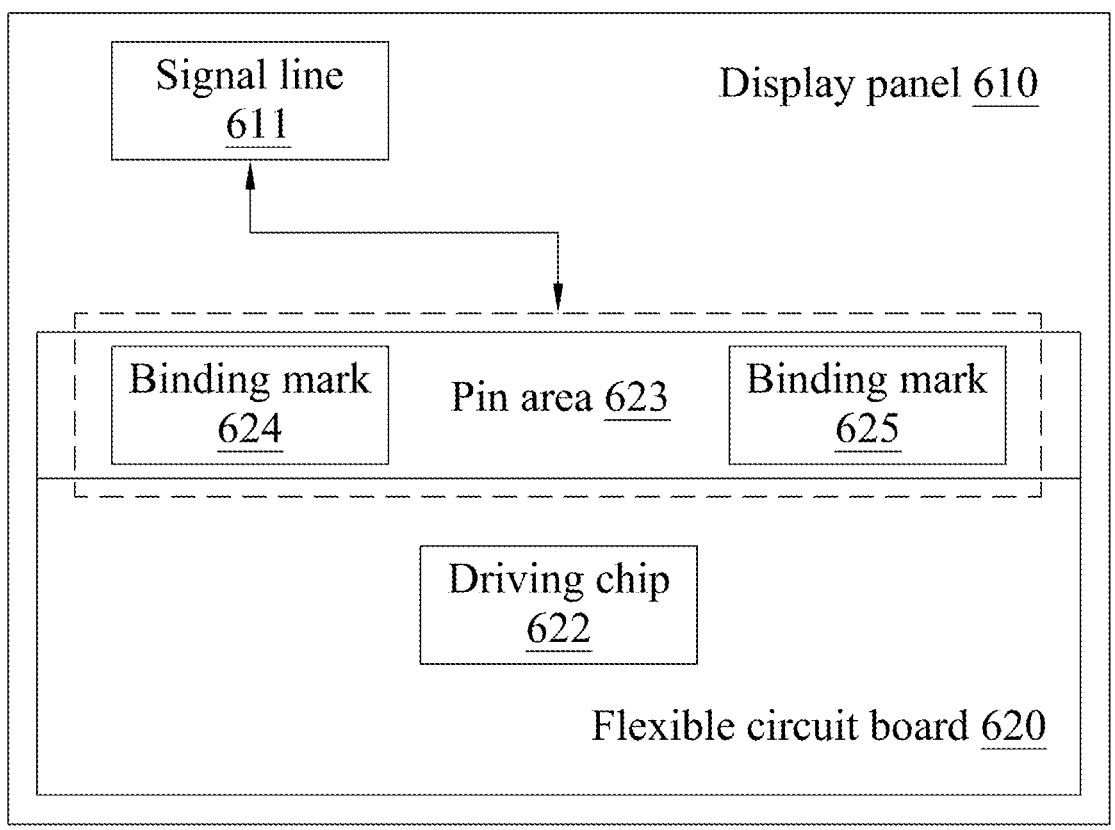
FIG. 6 is a schematic diagram of the structure of the display apparatus in the embodiments of the present disclosure.

As shown in FIG. 6, the present disclosure further provides a display apparatus 600, including a display panel 610 and a flexible circuit board 620. The display panel 610 includes a signal line 611. The flexible circuit board 620 is a flexible circuit board as described in any one of the aforementioned embodiments. The binding pins of the flexible circuit board 620 are bound with the signal lines of the display panel 610.

The present disclosure further provides a method of manufacturing a display apparatus, including the steps of:

providing a flexible circuit board;

disposing a binding mark 624 (625) at a pin area 623 within two outermost binding pins of the at least one side of the flexible circuit board; and aligning the binding mark 624 (625) of the flexible circuit board 620 and a mark on a display panel, and binding and connecting the binding pins of the flexible circuit board to the signal line 611 of the display panel 610.

In the present embodiment, the display panel is a liquid crystal display panel or an OLED display panel. In other embodiments, the display panel may be a display panel of other types.

Each of the technical features of the aforementioned embodiments may be combined variously. In order to make the description become clear, the combinations of all of the technical features of the aforementioned embodiments are not fully described. However, as long as the contradiction is not presented in these combinations, they should be considered as being contained within the scope stated in the present specification.

The aforementioned embodiments merely represent some of the implementation of the present disclosure. Even though these descriptions are relatively more particular and more detailed, they should not be considered as limitations of the scope of the claims of the disclosure. It has to be pointed out, a person skilled in the art is able to make various deformation and improvement without departing from the concept of the present disclosure, and these all belong to the scope protected in the present disclosure. Hence, the scope protected by the present disclosure patent shall be based on the appending claims.

What is claimed is:

1. A flexible circuit board, comprising:
a flexible substrate;
at least one driving chip disposed on the flexible substrate, wherein the driving chip is configured to form a driving signal;
a plurality of binding pins disposed on at least one side of the flexible substrate, wherein the binding pins are configured to bind and connect an external signal line to the driving chip; and
a binding mark disposed on the flexible substrate and positioned at a pin area within two outermost binding pins of the binding pins, wherein the binding mark is configured to perform an alignment operation of the flexible substrate being applied with a binding operation.

2. The flexible circuit board of claim 1, wherein
the binding pins are disposed at one side of the flexible substrate;
the number of the binding mark is at least two; and
the at least two binding marks are positioned at different positions of the pin area.

3. The flexible circuit board of claim 1, wherein
the number of the binding mark is two; and
the two binding marks are distributed within the pin area symmetrically.

4. The flexible circuit board of claim 1, wherein
the binding pins are disposed at two sides of the flexible substrate;
two of the binding marks are disposed at each side of the pin area; and
the two binding marks are disposed symmetrically about a central axis of the driving chip.

5. The flexible circuit board of claim 1, wherein
an alignment clearance area is disposed within the pin area;
no binding pin is in the alignment clearance area so that a length of the binding pin extending in a direction toward the alignment clearance area is less than a length of the binding pins in other areas; and
the binding mark is disposed within the alignment clearance area.

6. The flexible circuit board of claim 1, wherein
the binding mark is attached to the flexible substrate; and
all of the binding marks and each of the binding pins are made of metal.

7. The flexible circuit board of claim 1, wherein
the binding mark is a binding mark assembly; and
each of the binding mark assemblies comprises two binding units having different shapes.

8. The flexible circuit board of claim 1, wherein the binding mark has a shape of cross-shape, rectangle, T-shape or L-shape.

9. A display apparatus, comprising:
a display panel comprising a signal line;
a flexible circuit board comprising:
a flexible substrate;
a driving chip disposed on the flexible substrate, wherein the driving chips is configured to form a driving signal;
a plurality of binding pins disposed on at least one side of the flexible substrate, wherein the binding pins are configured to bind and connect an external signal line to the driving chip; and
a binding mark disposed on the flexible substrate and positioned at a pin area within two outermost binding pins of the binding pins, wherein the binding mark is configured to perform an alignment operation of the flexible substrate being applied with a binding operation.

10. The display apparatus of claim 9, wherein
each of the binding pins is disposed at one side of the flexible substrate;
the number of the binding mark is at least two; and
the at least two binding marks are positioned at different positions of the pin area.

11. The display apparatus of claim 9, wherein
the number of the binding mark is two; and
the two binding marks are distributed within the pin area symmetrically.

12. The display apparatus of claim 9, wherein
each of the binding pins is disposed at two sides of the flexible substrate;
two of the binding marks are disposed at each side of the pin area; and
the two binding marks are disposed symmetrically about a central axis of the driving chip.

13. The display apparatus of claim 9, wherein
an alignment clearance area is disposed within the pin area;
no binding pin is in the alignment clearance area so that a length of the binding pin extending in a direction toward the alignment clearance area is less than a length of the binding pin in other areas; and
the binding mark is disposed within the alignment clearance area.

14. The display apparatus of claim 9, wherein
the binding mark is attached to the flexible substrate; and
all of the binding marks and the binding pins are made of metal.

15. The display apparatus of claim 9, wherein
the binding mark is a binding mark assembly; and
each of the binding mark assemblies comprises two binding units having different shapes.

16. The display apparatus of claim 9, wherein the binding mark has a shape of cross-shape, rectangle, T-shape or L-shape.

* * * * *